US012538423B2

(12) United States Patent
Choi et al.

(10) Patent No.: US 12,538,423 B2
(45) Date of Patent: Jan. 27, 2026

(54) CIRCUIT BOARD

(71) Applicant: LG INNOTEK CO., LTD., Seoul (KR)

(72) Inventors: Byeong Kyun Choi, Seoul (KR); Moo Seong Kim, Seoul (KR); Woo Seop Sim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 205 days.

(21) Appl. No.: 18/577,077

(22) PCT Filed: Jul. 8, 2022

(86) PCT No.: PCT/KR2022/009939
§ 371 (c)(1),
(2) Date: Jan. 5, 2024

(87) PCT Pub. No.: WO2023/282692
PCT Pub. Date: Jan. 12, 2023

(65) Prior Publication Data
US 2024/0324102 A1    Sep. 26, 2024

(30) Foreign Application Priority Data

Jul. 8, 2021   (KR) .......................... 10-2021-0089784

(51) Int. Cl.
*H05K 1/11*     (2006.01)
*H01L 23/498*   (2006.01)
(Continued)

(52) U.S. Cl.
CPC ........ *H05K 1/115* (2013.01); *H01L 23/49822* (2013.01); *H05K 1/09* (2013.01); *H05K 1/181* (2013.01); *H05K 2201/09827* (2013.01)

(58) Field of Classification Search
CPC ........ H05K 1/115; H05K 2201/09827; H05K 3/4623
See application file for complete search history.

(56) References Cited

U.S. PATENT DOCUMENTS 6,255,039 B1    7/2001  Xu et al.
8,835,303 B2 *  9/2014  Feustel ............ H01L 21/76804
                                                257/E21.585
(Continued)

FOREIGN PATENT DOCUMENTS

JP      2000-252628 A    9/2000
JP      2004-221192 A    8/2004
(Continued)

*Primary Examiner* — Sherman Ng
(74) *Attorney, Agent, or Firm* — Birch, Stewart, Kolasch & Birch, LLP

(57) ABSTRACT

A circuit board according to an embodiment includes an insulating layer, a first circuit pattern layer disposed on the insulating layer; a second circuit pattern layer disposed below the insulating layer; and a via passing through the insulating layer and connecting the first circuit pattern layer and the second circuit pattern layer, wherein the via has a first width at an upper surface and a second width less than the first width at a first region between the upper surface and a lower surface, wherein the first region is a region with a minimum width among all regions of the via, and wherein the second width satisfies a range of 70% to 99% of the first width.

15 Claims, 10 Drawing Sheets

(51) Int. Cl.
*H05K 1/09* (2006.01)
*H05K 1/18* (2006.01)
*H05K 3/46* (2006.01)

(56) References Cited

U.S. PATENT DOCUMENTS

| | | |
|---|---|---|
| 10,903,170 B2 | 1/2021 | Lee et al. |
| 2006/0102383 A1 | 5/2006 | Cha et al. |
| 2007/0284602 A1* | 12/2007 | Chitnis .............. H10H 20/8312 |
| | | 438/455 |
| 2008/0314633 A1 | 12/2008 | Kang et al. |
| 2009/0294164 A1* | 12/2009 | Kim ...................... H05K 1/116 |
| | | 174/262 |
| 2014/0054069 A1* | 2/2014 | Lee ........................ H05K 3/202 |
| | | 174/251 |
| 2016/0192491 A1* | 6/2016 | Kang ...................... H05K 1/113 |
| | | 174/262 |
| 2020/0083179 A1 | 3/2020 | Lee et al. |
| 2020/0163228 A1 | 5/2020 | Lee et al. |
| 2023/0090350 A1* | 3/2023 | Mcelhinny et al. .... H01L 25/50 |
| | | 257/774 |

FOREIGN PATENT DOCUMENTS

| | | |
|---|---|---|
| JP | 2008-113022 A | 5/2008 |
| KR | 10-2001-0006436 A | 1/2001 |
| KR | 10-2006-0054578 A | 5/2006 |
| KR | 10-0832651 B1 | 5/2008 |
| KR | 10-2017-0087302 A | 7/2017 |
| KR | 10-2020-0028602 A | 3/2020 |
| KR | 10-2020-0056833 A | 5/2020 |
| KR | 10-2021-0024849 A | 3/2021 |

* cited by examiner

[FIG. 1a]
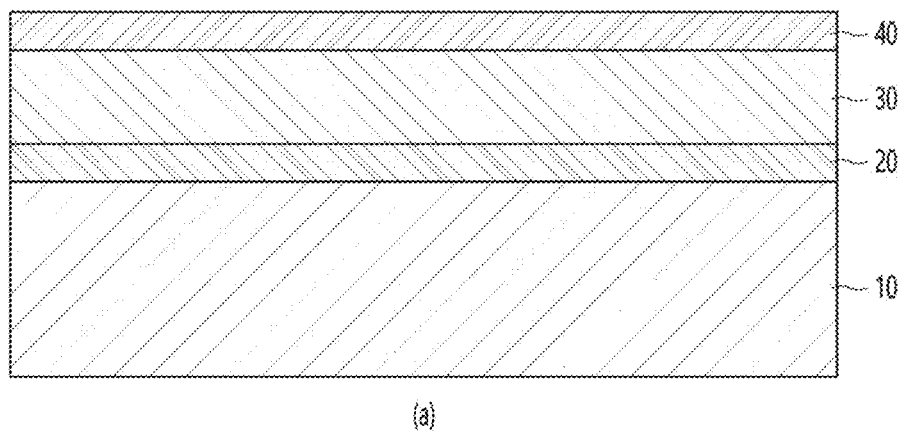
(a)
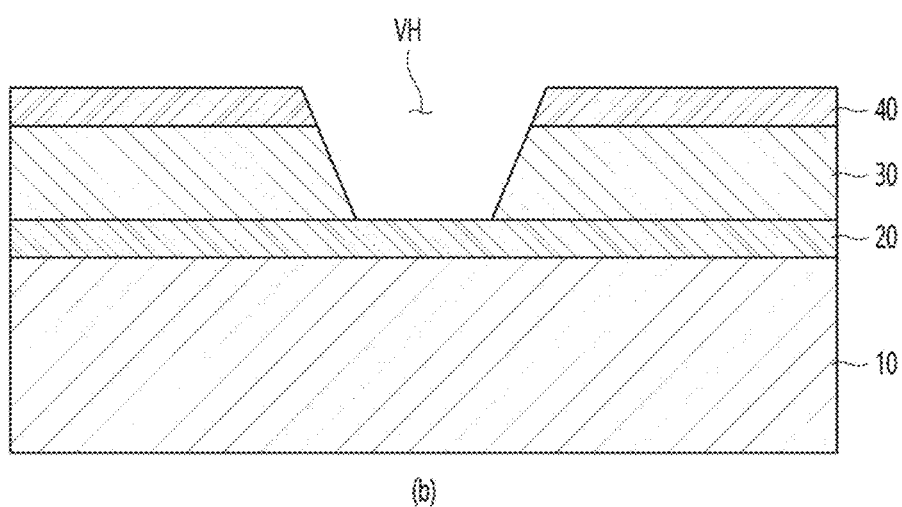
(b)

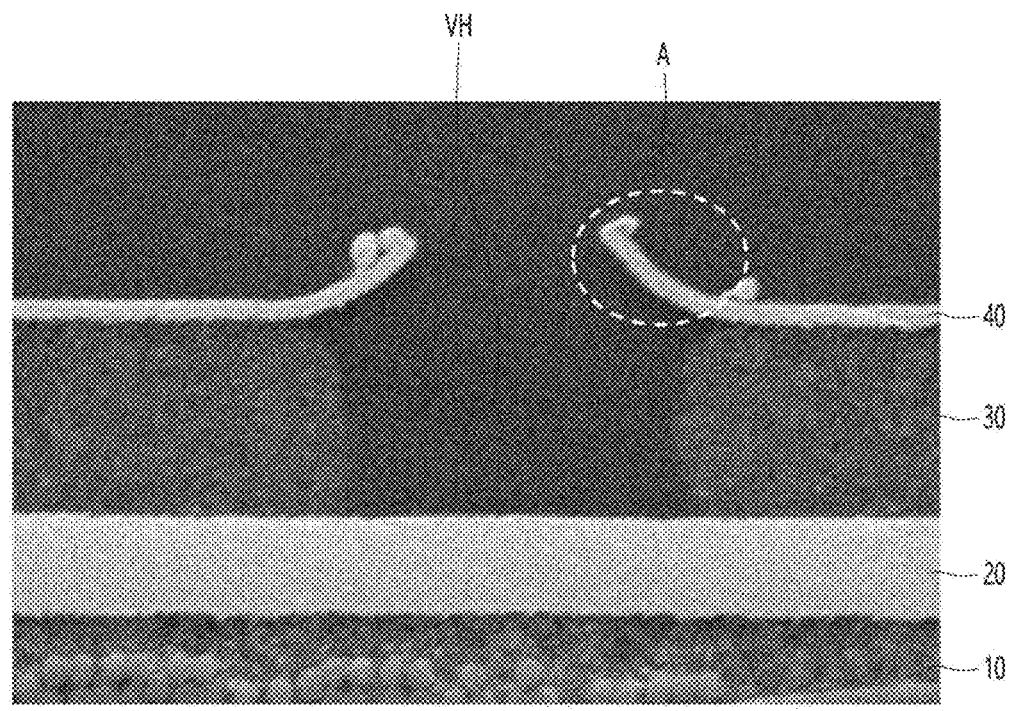
[FIG. 1b]

[FIG. 1c]
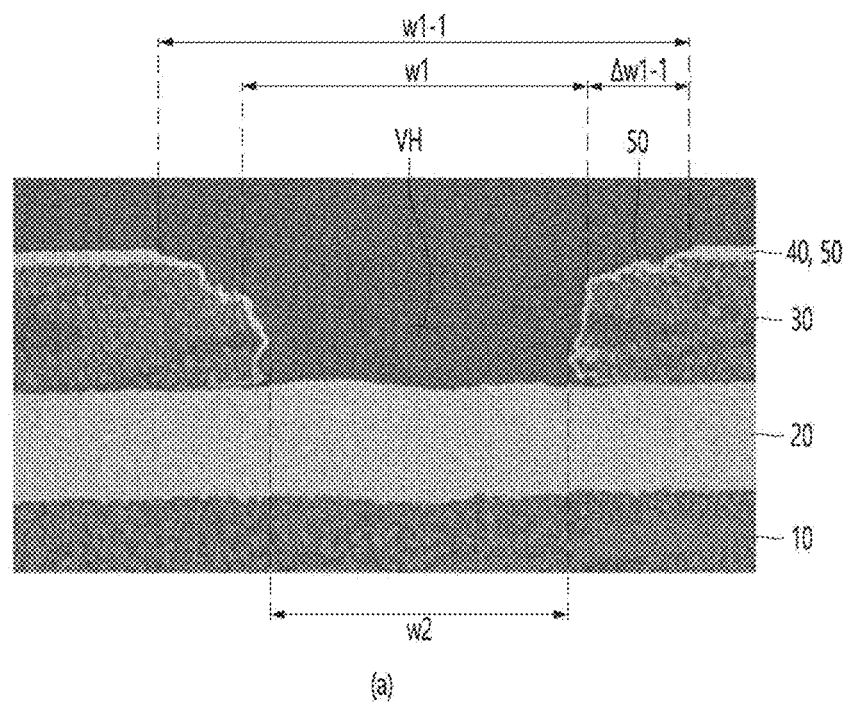
(a)
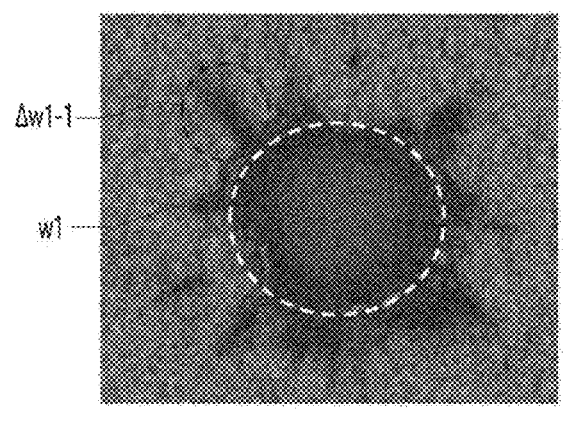
(b)

[FIG. 1d]
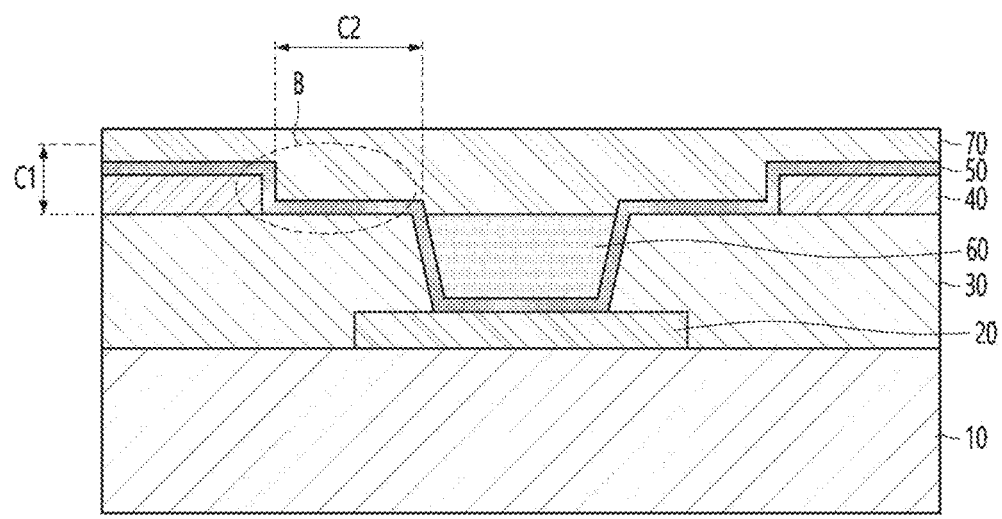

[FIG. 2]
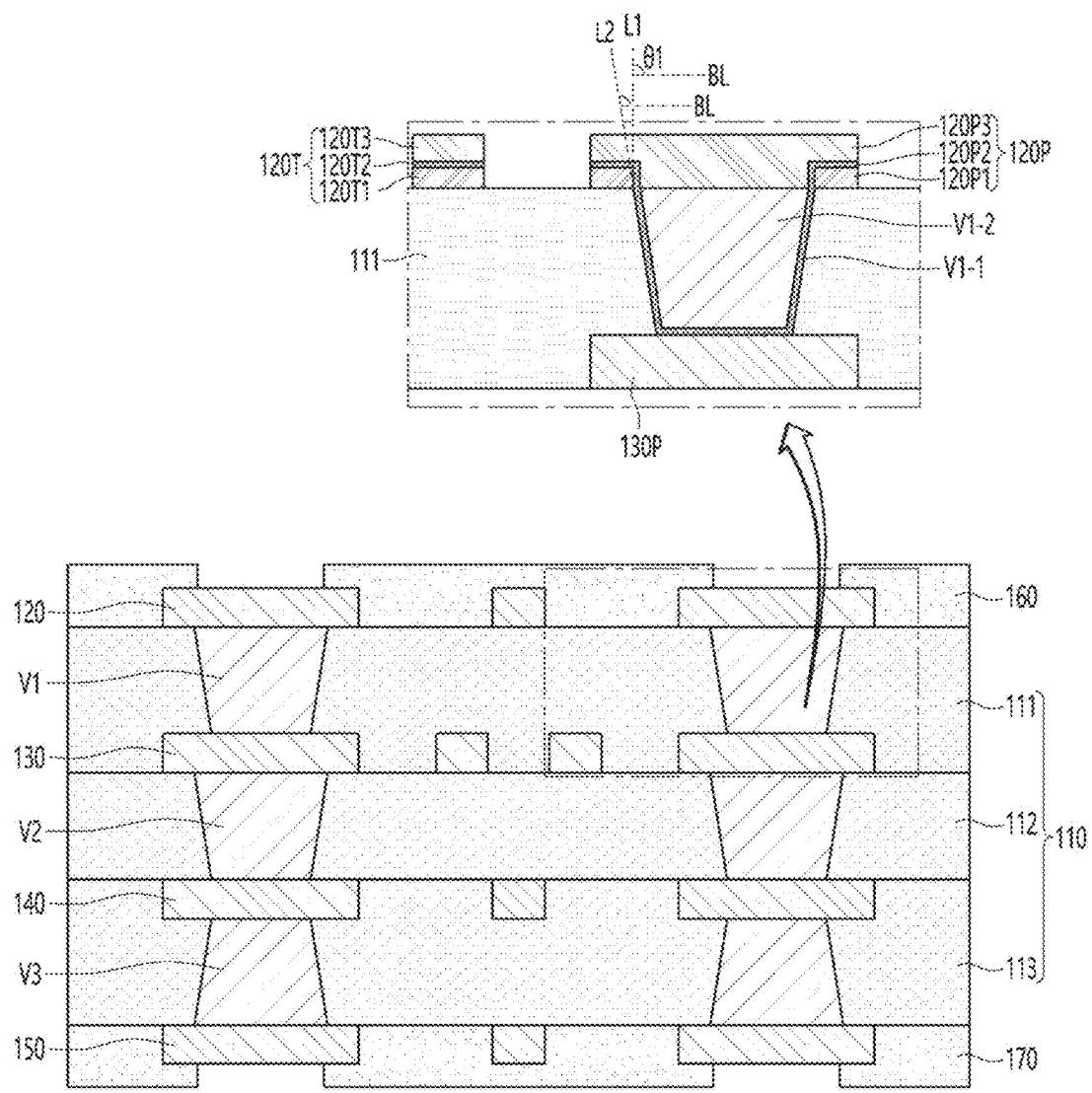

[FIG. 3]
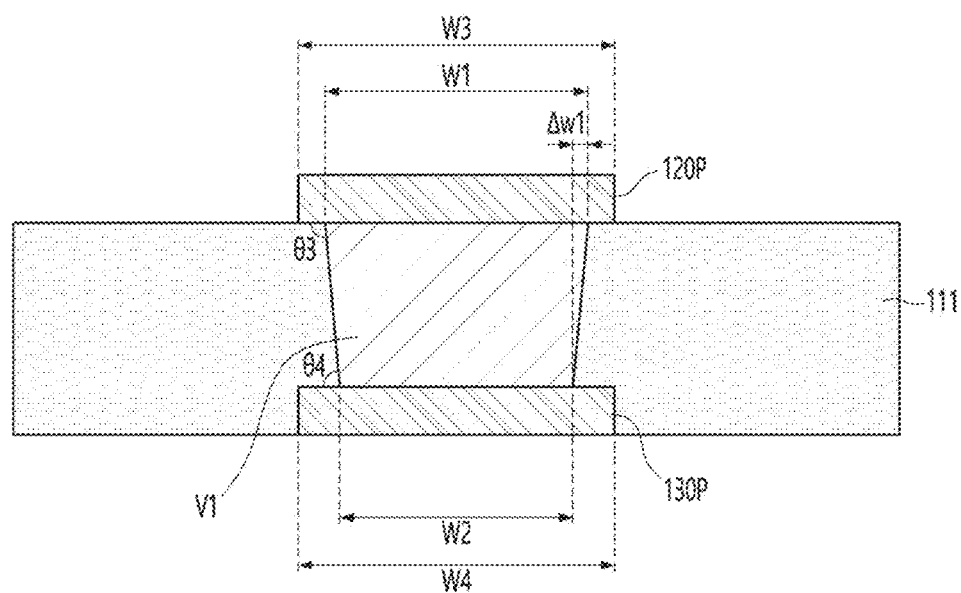

[FIG. 4]
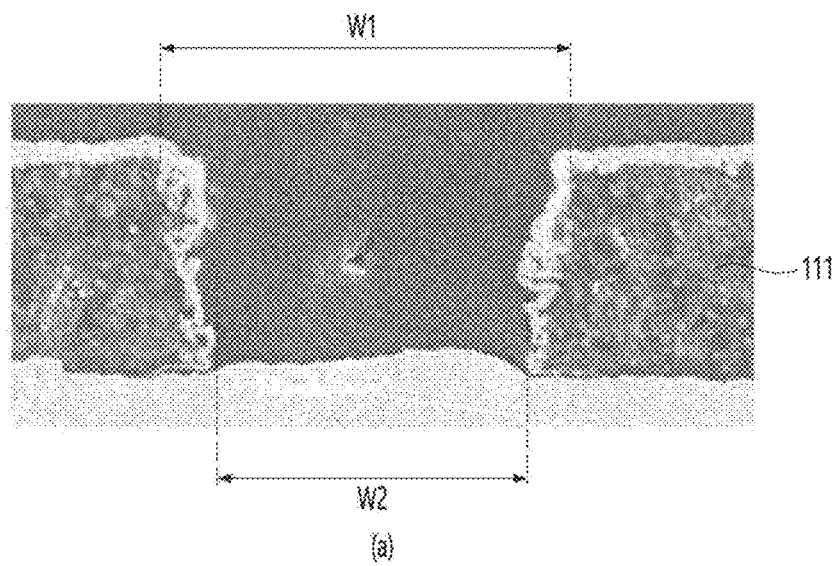
(a)
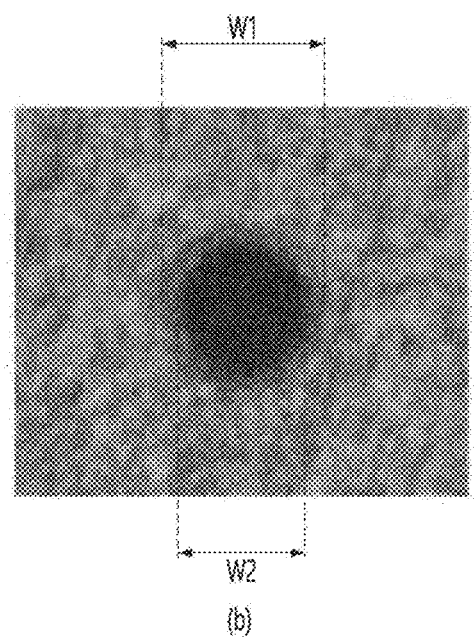
(b)

[FIG. 5]
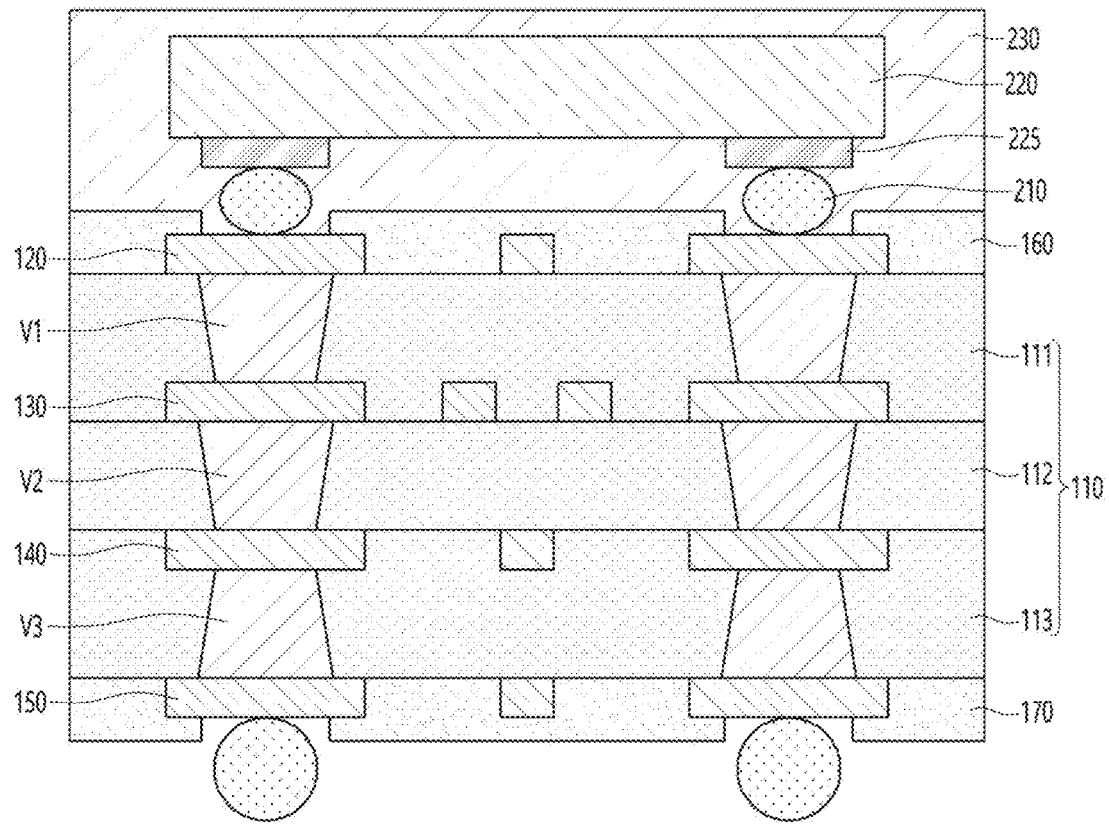
[FIG. 6]
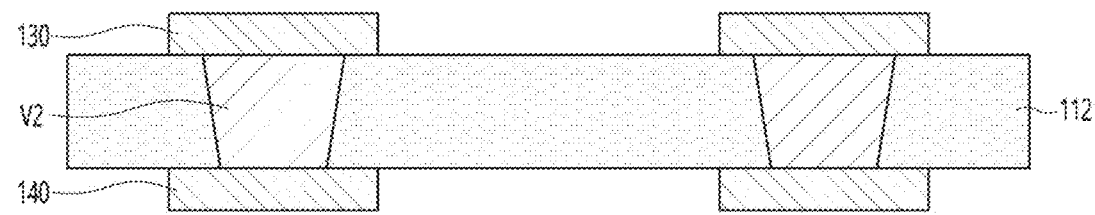

[FIG. 7]
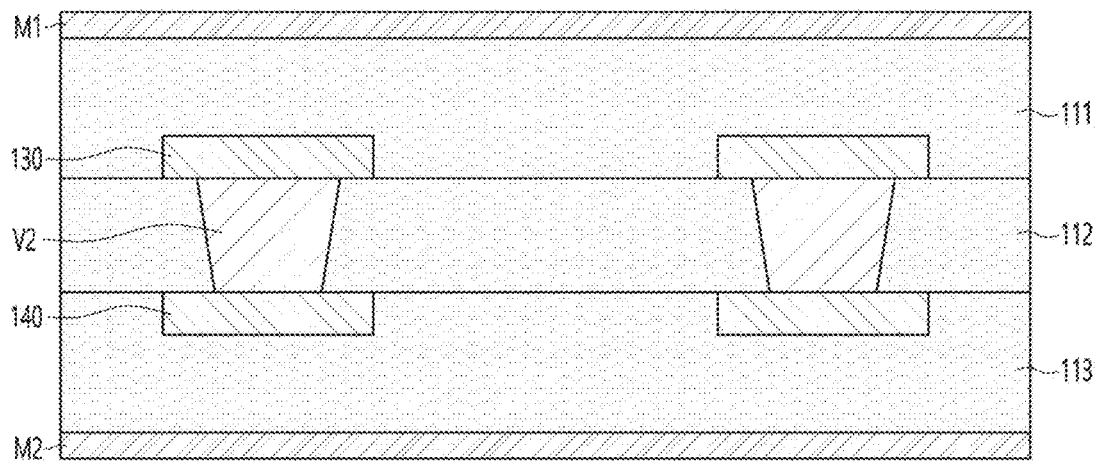
[FIG. 8]
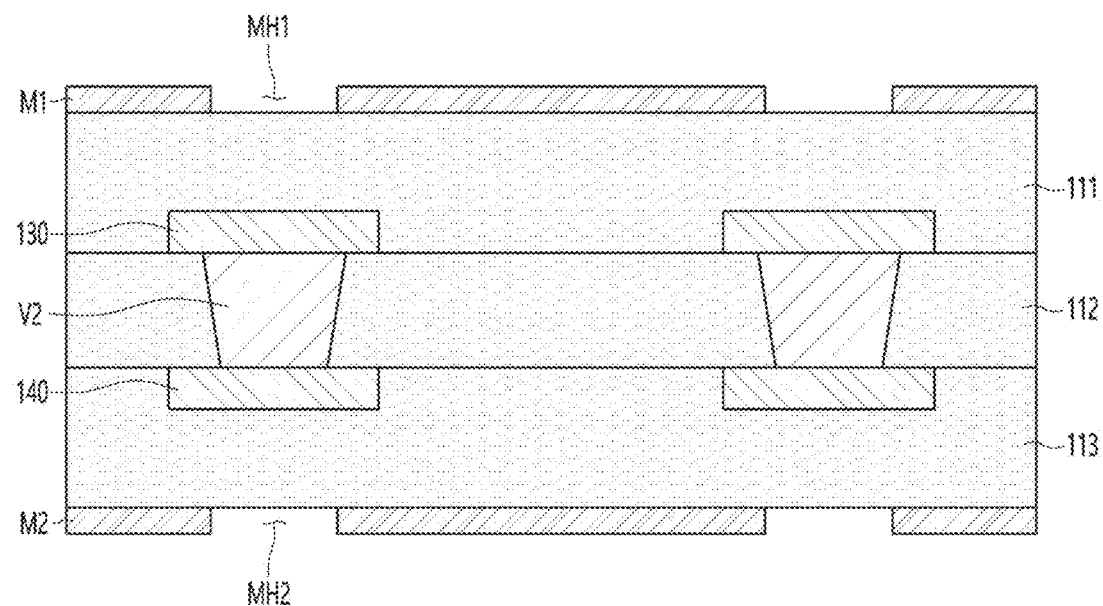

[FIG. 9]
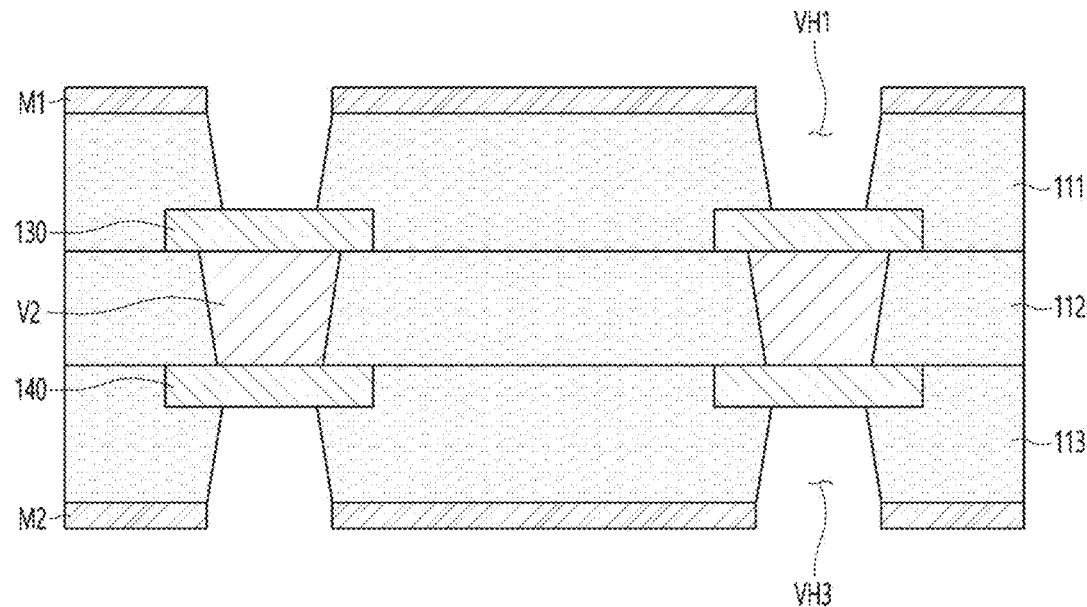
[FIG. 10]
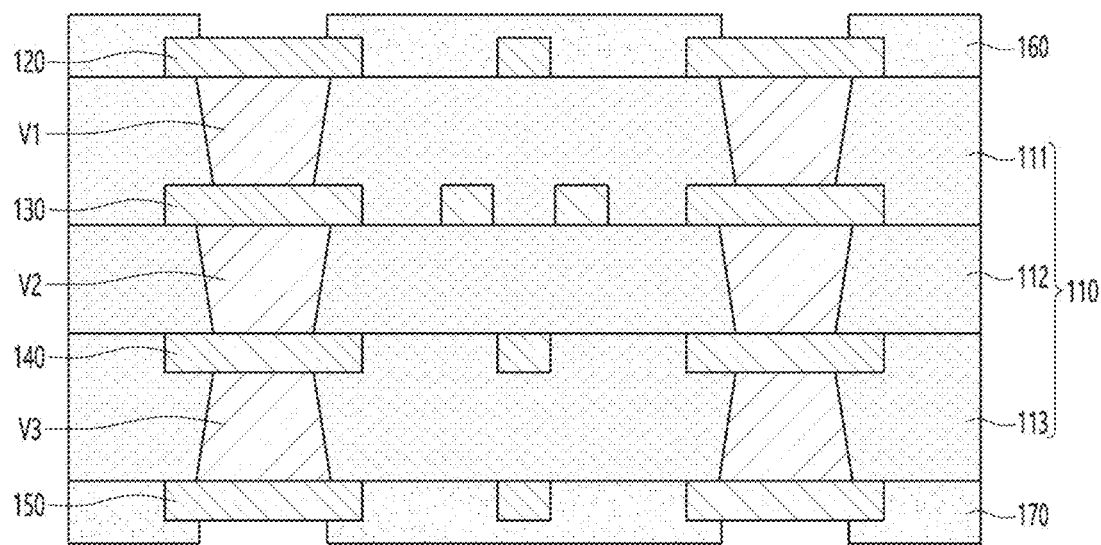

CIRCUIT BOARD

CROSS REFERENCE TO RELATED APPLICATIONS

This application is the National Phase of PCT International Application No. PCT/KR2022/009939, filed on Jul. 8, 2022, which claims priority under 35 U.S.C. 119 (a) to Patent Application No. 10-2021-0089784, filed in the Republic of Korea on Jul. 8, 2021, all of which are hereby expressly incorporated by reference into the present application.

BACKGROUND

Technical Field

The embodiment relates to a circuit board and a package substrate including the same.

Discussion of the Related Art

A printed circuit board (PCB) is formed by printing a circuit line pattern with a conductive material such as copper on an electrically insulating board, and refers to a board immediately before mounting electronic components. In other words, it refers to a circuit board in which a mounting position of each component is determined and a circuit pattern connecting the components is printed and fixed on the surface of the flat plate in order to densely mount many different types of electronic devices on a flat plate.

Signals generated from the components mounted on the printed circuit board can be transmitted through circuit patterns connected to each component.

Meanwhile, in order to perform high-speed processing of large amounts of information with the recent advancement in functionality of portable electronic devices, etc., signals are becoming higher frequency, and circuit patterns for printed circuit boards suitable for high-frequency applications are required.

In this case, the circuit pattern of the printed circuit board must minimize signal transmission loss to enable signal transmission without deteriorating the quality of high-frequency signals.

The insulating layer used in circuit boards for high-frequency applications must have isotropy of electrical properties for ease of circuit pattern design and processing, low reactivity with metal wiring materials, low ionic transferability and sufficient mechanical strength to withstand processes such as chemical mechanical polishing (CMP), peeling or low moisture absorption rate to prevent dielectric constant increase, heat resistance to withstand process processing temperatures, and a low thermal expansion coefficient to eliminate cracks due to temperature changes.

In addition, the insulating layer used in circuit boards for high-frequency applications must satisfy various conditions, such as adhesion that can minimize various stresses and peeling occurring at the interface with the metal thin film layer, crack resistance, low stress and low high-temperature gas generation, etc., and for this purpose, resin coated copper (RCC) is used.

However, in these resin coated copper, a filler content is reduced in order to achieve a low dielectric constant, and as the filler content decreases, it is difficult to realize a normal via hole shape. For example, when forming a via hole in low dielectric constant copper foil adhesive resin using a laser drill method, there are limitations in forming the via hole of a desired fine size (for example, 50 µm or less).

Accordingly, for circuit integration, a new circuit board including a fine via hole and a fine via is required.

SUMMARY

An embodiment provides a circuit board including a fine via and a package substrate including the same.

Additionally, the embodiment provides a circuit board including a via with a minimized difference between a maximum width and a minimum width, and a package substrate including the same.

Technical problems to be solved by the proposed embodiments are not limited to the above-mentioned technical problems, and other technical problems not mentioned may be clearly understood by those skilled in the art to which the embodiments proposed from the following descriptions belong.

A circuit board according to an embodiment includes an insulating layer; a first circuit pattern layer disposed on the insulating layer; a second circuit pattern layer disposed below the insulating layer; and a via passing through the insulating layer and connecting the first circuit pattern layer and the second circuit pattern layer, wherein the via has a first width at an upper surface and a second width less than the first width at a first region between the upper surface and a lower surface, wherein the first region is a region with a minimum width among all regions of the via, and wherein the second width satisfies a range of 70% to 99% of the first width.

In addition, the first width is one of a maximum width or an average width of the upper surface of the via.

In addition, one-half of a difference between the first width and the second width of the via satisfies a range of 0.1% to 20% of the first width.

In addition, the first circuit pattern layer includes a first pad in direct contact with the upper surface of the via, and wherein the second circuit pattern layer includes a second pad in direct connect with the lower surface of the via.

In addition, the first pad has a third width, and wherein one-half of a difference between the third width of the first pad and the second width of the via is 4.0 µm or less.

In addition, the first pad has a third width, and wherein one-half of a difference between the third width of the first pad and the first width of the via satisfies a range of 0.75 µm to 2.97 µm.

In addition, wherein the first pad comprises: a copper foil layer disposed on an upper surface of the insulating layer, a first plating layer disposed on the copper foil layer, and a second plating layer disposed on the first plating layer.

In addition, the first plating layer of the first pad does not directly contact the upper surface of the insulating layer.

In addition, a side surface of the copper foil layer of the first pad has a first inclination angle, and wherein a side surface of the via has a second inclination angle different from the first inclination angle.

In addition, the insulating layer includes one of RCC (Resin coated copper) or prepreg.

In addition, the insulating layer has a dielectric constant (Dk) between 2.0 and 3.0.

Meanwhile, a package substrate according to the embodiment includes a plurality of insulating layers; a circuit pattern layer disposed on the plurality of insulating layers; a via that passes through a plurality of insulating layers and connects circuit pattern layers disposed on different insulating layers; a connection part disposed on a circuit pattern layer of an uppermost insulating layer among the plurality of insulating layers; a chip disposed on the connection part; a molding layer disposed on the uppermost insulating layer and molding the chip, wherein the via has a first width at an upper surface and a second width less than the first width at a first region between the upper surface and a lower surface, wherein the first region is a region with a minimum width among all regions of the via, and wherein the second width satisfies a range of 70% to 99% of the first width.

In addition, the chip includes a first chip and a second chip arranged to be spaced apart from each other in a width direction, the first chip corresponds to a central processor (CPU), and the second chip corresponds to a graphics processor (GPU).

Advantageous Effects

The embodiment manufactures a circuit board using RCC or prepreg rather than a photosensitive material. That is, PID, which is generally a photosensitive material, has a dielectric constant (Dk) exceeding 3.0, and accordingly, it is difficult to apply it to boards that use frequencies higher than those for 5G. For example, in a 5G board, a dielectric constant of the board must be low. However, the dielectric constant of general PID exceeds 3.0. Accordingly, when applying the PID to a 5G board, there is a problem that signal transmission loss increases when transmitting a large signal. In addition, when a circuit board is implemented using a PID, a sputter, which is a deposition equipment, must be used in the plating process for circuit formation on the circuit board including the PID, which has the problem of increasing process costs. Furthermore, in the circuit board including the PID, there is a problem in that the adhesion between the insulating layer composed of the PID and the circuit pattern is low, and as a result, the circuit pattern is separated from the insulating layer. For example, the circuit board including a PID requires a high process temperature (e.g., 250 degrees or more) during the circuit pattern formation process or soldering process. Due to such a high processing temperature, the adhesion between the PID and the circuit pattern is reduced, causing the circuit pattern to be separated from the insulating layer.

Accordingly, the insulating layer in the embodiment may be formed of RCC or prepreg having a dielectric constant (Dk) between 2.0 and 3.0. Accordingly, the embodiment provides a circuit board with a low dielectric constant, enabling application to 5G products and solving the reliability problem of the PID.

Meanwhile, the insulating layer containing RCC or prepreg has limitations in forming small vias. At this time, the embodiment allows the copper foil layer to be removed first when forming a via hole in an insulating layer in which a copper foil layer is laminated on its surface. For example, the embodiment allows some regions of the copper foil layer corresponding to locations where via holes were formed to be preferentially removed by etching. And, in the embodiment, a laser processing process is performed on the surface of the insulating layer exposed through removal of the copper foil layer to form a via hole of a desired size. Accordingly, in the embodiment, only the insulating layer needs to be processed in the via hole forming process, and thus an intensity of the laser can be lowered compared to a comparative example. Through this, the embodiment can reduce the difference between the maximum and minimum width of the via hole, thereby enabling the formation of a small via.

BRIEF DESCRIPTION OF THE DRAWINGS

FIG. 1a is a view showing a via hole forming process according to a comparative example.

FIG. 1b is a view showing a processing problem that appears in a via hole forming process in a comparative example.

FIG. 1c is a view showing a size of a via hole according to a comparative example.

FIG. 1d is a view showing a circuit board according to a comparative example.

FIG. 2 is a view showing a circuit board according to an embodiment.

FIG. 3 is an enlarged view of the via of the circuit board of FIG. 2.

FIG. 4 is a view showing an actual shape of a via hole formed according to an embodiment.

FIG. 5 is a view showing a package substrate according to an embodiment.

FIGS. 6 to 10 are views showing the manufacturing method of the circuit board shown in FIG. 2 in order of processes.

DETAILED DESCRIPTION OF THE EMBODIMENTS

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

Further, when expressed as "on (over)" or "under (below)", it may include not only the upper direction but also the lower direction based on one element.

Before explaining a present embodiment, a circuit board of a comparative example compared to this embodiment will be described.

FIG. 1a is a view showing a via hole forming process according to a comparative example, FIG. 1b is a view showing a processing problem that appears in a via hole forming process in a comparative example, FIG. 1c is a view showing a size of a via hole according to a comparative example, and FIG. 1d is a view showing a circuit board according to a comparative example.

Referring to FIGS. 1a to 1d, in the comparative example, it is difficult to refine the size of the via hole, and further, there is a limit to miniaturizing the size of the via filling the inside of the via hole.

As shown in (a) of FIG. 1a, the circuit board in the comparative example has a laminated structure including a substrate 10, a metal layer 20, an insulating layer 30, and a copper foil layer 40.

The substrate 10 may refer to one insulating layer among a plurality of insulating layers constituting a circuit board, or, alternatively, may be a support substrate formed to manufacture a coreless substrate.

When the substrate 10 refers to one insulating layer among a plurality of insulating layers, the metal layer 20 may refer to a via pad connected to a via among the circuit patterns disposed on the one insulating layer. In addition, when the substrate 10 refers to a support substrate, the metal layer 20 may refer to a copper foil layer disposed on the support substrate.

Generally, a circuit board is made by stacking an insulating layer 30 and a copper foil layer 40 on the substrate 10 and the metal layer 20 and forming a circuit pattern or via using the insulating layer 30 and the copper foil layer 40.

The insulating layer 30 is made of prepreg or RCC (resin coated copper).

At this time, in the comparative example, as shown in (b) of FIG. 1a, a via hole (VH) is formed that exposes the upper surface of the metal layer 20 while penetrating the insulating layer 30 and the copper foil layer 40 by irradiating a laser (not shown) on the insulating layer 30 and the copper foil layer 40. At this time, the laser may be a carbon dioxide (CO2) laser, and the insulating layer 30 and the copper foil layer 40 are simultaneously processed using this laser to form the via hole (VH).

However, a laser processing degree of the insulating layer 30 and a laser processing degree 40 of the copper foil layer 40 appear different from each other. For example, a strength of the insulating layer 30 and a strength of the copper foil layer 40 are different from each other. Accordingly, when a laser of a certain intensity is irradiated, the degree of processing of the insulating layer 30 and the degree of processing of the copper foil layer 40 appear to be different from each other.

Accordingly, when a laser irradiation intensity is lower than a reference value, there is debris (A) such as a burr that is not completely removed from the copper foil layer 40 in a region overlapping in the perpendicular direction with the via hole VH as shown in FIG. 1b. In addition, the debris (A) causes a short circuit problem by connecting circuit patterns or vias that should be electrically separated from each other.

Therefore, in the comparative example, the laser irradiation intensity is increased to completely remove debris (A) such as burrs from the copper foil layer (40). However, when forming the via hole (VH) using this method, there is a problem in that the size of the via hole (VH) becomes larger than the target size. Furthermore, in the comparative example, there is a problem in which the laser is intensively irradiated to the upper region of the insulating layer 30 adjacent to the copper foil layer 40, and as a result, there is a problem in that the upper width of the via hole (VH) becomes larger than the target size. Through this, the comparative example has a problem in that the difference between the maximum and minimum widths of the via hole (VH) increases.

Specifically, as shown in (a) and (b) of FIG. 1c, in the comparative example, the via hole forming process is performed with the target that the maximum width of the via hole VH has the first width (w1) and the minimum width of the via hole VH has the second width (w2).

However, the insulating layer 30 and the copper foil layer 40 are processed together to form a via hole (VH), so that there is a problem in that the maximum width of the via hole (VH) has a 1-1 width (w1-1) that is larger than the first width (w1). That is, in the comparative example, an upper region of the via hole (VH) is provided with a step region having a 1-1 width (w1-1) that is larger than the first width (w1) by a first difference value (Δ-1).

Therefore, the via hole (VH) in the comparative example has a maximum width of 1-1 width (w1-1) and a minimum width of second width (w2), and accordingly, the second width (w2) has a value of 60% or less of the 1-1 width (w1-1). In addition, the circuit board in the comparative example has a problem in that the difference between the maximum and minimum widths of the vias that fill the via holes (VH) is large, and as a result, there is a problem of increased signal transmission loss.

Additionally, in the comparative example, it is difficult to accurately determine the size of the via hole due to the step region of the via hole (VH), and furthermore, it is difficult to accurately determine the size of the via filling the inside of the via hole.

For example, in the comparative example, a step region is formed in a region corresponding to the first difference value (Δ-1) in FIG. 1c. And, generally, both the copper foil layer 40 and the first plating layer 50 must be present on the upper surface of the insulating layer 20. However, in the comparative example, the copper foil layer 40 in the step region is removed, so that only the first plating layer 50 exists.

Specifically, as shown in FIG. 1d, in the comparative example, when the via hole (VH) is formed in order to form a via, a seed layer such as the first plating layer 50 is formed on the inner wall of the via hole VH and the copper foil layer 40. Thereafter, in the comparative example, electrolytic plating is performed using the first plating layer 50 as a seed layer to form second plating layers 60 and 70 that fill the interior of the via hole VH and extend above it.

However, the comparative example has a step region as the laser irradiation conditions for removing the copper foil layer 40 are applied during the formation of the via hole (VH), and accordingly, there is a problem in that a step portion B is provided between the copper foil layer 40 and the first plating layer 50 on the upper surface of the insulating layer 30.

For example, in the process of forming the via hole (VH), the copper foil layer 40 is removed while having a width greater than the upper width of the via hole (VH), and accordingly, the first plating layer 50 is disposed on the inner wall of the copper foil layer 40 and the upper surface of the insulating layer 30. At this time, the step portion (B) acts as a factor causing signal loss in situations where signals are transmitted through circuit patterns or vias.

At this time, in the comparative example, the laser process conditions in the process of forming the via hole (VH) are set to conditions for removing the copper foil layer 40, and accordingly, a length of the step portion B in a horizontal direction increases. Additionally, as the length of the step portion B increases in the horizontal direction, there is a problem that the size of the via hole and the size of the via increases.

Specifically, in the comparative example, a horizontal length C1 of the step portion B is greater than a thickness C2 of the circuit pattern. For example, the thickness (C2) of the circuit pattern in the comparative example corresponds to a sum of a thickness of the copper foil layer 40, a thickness of the first plating layer 50, and a thickness of the second plating layer 70. And, in the comparative example, the horizontal length C1 of the step portion B is greater than the thickness C2 of the circuit pattern (or the vertical length of the circuit pattern).

Accordingly, the embodiment provides a circuit board with a new structure that can eliminate the step portion while reducing the size of the via hole and the size of the via, and a package substrate including the same.

FIG. 2 is a view showing a circuit board according to an embodiment, FIG. 3 is an enlarged view of the via of the circuit board of FIG. 2, and FIG. 4 is a view showing an actual shape of a via hole formed according to an embodiment.

In an embodiment, a size of the via can be reduced by filling an inside of a via hole formed using a laser process to form a via, and further, a difference between the maximum and minimum width of the via can be minimized. Hereinafter, the circuit board of the embodiment will be described in detail.

Referring to FIGS. 2 to 4, the circuit board includes an insulating layer 110, a circuit pattern layer, a via, and a protective layer.

The insulating layer 110 may have a multiple layer structure. For example, the insulating layer 110 may include a first insulating layer 111, a second insulating layer 112, and a third insulating layer 113. At this time, the circuit board is shown in the drawing as having a three-layer structure based on the number of insulating layers, but the embodiment is not limited to this. For example, the circuit board may have a structure of two or less layers based on the number of insulating layers, or alternatively, the circuit board may have a structure of four or more layers based on the number of insulating layers.

For example, the first insulating layer 111 may be a first outermost insulating layer disposed on a first outermost side in a multi-layer structure. For example, the first insulating layer 111 may be an insulating layer disposed on an uppermost side of the circuit board. The second insulating layer 112 may be an inner insulating layer disposed on an inside in a multi-layer structure. The third insulating layer 113 may be a second outermost insulating layer disposed on a second outermost side in a multi-layer structure. For example, the third insulating layer 113 may be an insulating layer disposed on a lowermost side of the circuit board. In addition, the inner insulating layer is shown as being composed of one layer, but differently, it may be composed of two or more layers.

The insulating layer 110 is a board on which an electric circuit whose wiring can be changed is organized, and may include both a print, a wiring board, and an insulating board made of insulating material capable of forming circuit patterns on its surface.

For example, at least one of the insulating layers 110 may be rigid or flexible. For example, at least one of the insulating layers 110 may include glass or plastic. Specifically, at least one of the insulating layers 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, at least one of the insulating layers 110 may include an optically isotropic film. As an example, at least one of the insulating layers 110 may include cyclic olefin copolymer (COC), cyclic olefin polymer (COP), optically isotropic PC, optically isotropic polymethylmethacrylate (PMMA), or the like.

In addition, at least one of the insulating layers 110 may be formed of a material containing an inorganic filler and an insulating resin. For example, the material constituting the insulating layer 110 can be resins containing reinforcing materials such as inorganic fillers such as silica and alumina with thermosetting resins such as epoxy resins and thermoplastic resins such as polyimide, specifically ABF (Ajinomoto Build-up Film), FR-4, BT (Bismaleimide Triazine), PID (Photo Imageable Dielectric resin), BT, etc.

In addition, at least one of the insulating layers 110 may be partially bent while having a curved surface. That is, at least one of the insulating layers 110 may partially have a plane and may partially be bent while having a curved surface. Specifically, an end portion of at least one of the insulating layers 110 may be bent while having a curved surface, or bent or crooked while having a surface with a random curvature.

A circuit pattern layer may be disposed on a surface of the insulating layer 110.

For example, a first circuit pattern layer 120 may be disposed on the first or upper surface of the first insulating layer 111. For example, a second circuit pattern layer 130 may be disposed between the second surface or lower surface of the first insulating layer 111 and the first surface or upper surface of the second insulating layer 112. For example, a third circuit pattern layer 140 may be disposed between the second surface or lower surface of the second insulating layer 112 and the first surface or upper surface of the third insulating layer 113. For example, a fourth circuit pattern layer 150 may be disposed on the second or lower surface of the third insulating layer 113. The first circuit pattern layer 120 may be a circuit pattern layer disposed on the first outermost side or uppermost side of the circuit board. Additionally, the second circuit pattern layer 130 and the third circuit pattern layer 140 may be inner circuit pattern layers disposed inside the circuit board. Additionally, the fourth circuit pattern layer 150 may be a circuit pattern layer disposed on the second outermost side or lowermost side of the circuit board.

The first circuit pattern layer 120, the second circuit pattern layer 130, the third circuit pattern layer 140, and the fourth circuit pattern layer 150 are wirings that transmit electrical signals, and may be formed of a metal material having high electrical conductivity. To this end, the first circuit pattern layer 120, the second circuit pattern layer 130, the third circuit pattern layer 140, and the fourth circuit pattern layer 150 may be formed of at least one metal material selected from gold (Au), silver (Ag), platinum (Pt), titanium (Ti), tin (Sn), copper (Cu), and zinc (Zn). In addition, the first circuit pattern layer 120, the second circuit pattern layer 130, the third circuit pattern layer 140, and the fourth circuit pattern layer 150 may be formed of a paste or solder paste including at least one metal material selected from gold (Au), silver (Ag), platinum (Pt), titanium (Ti), tin (Sn), copper (Cu), and zinc (Zn) having excellent bonding strength. Preferably, the first circuit pattern layer 120, the second circuit pattern layer 130, the third circuit pattern layer 140, and the fourth circuit pattern layer 150 may be formed of copper (Cu), which has high electrical conductivity and is relatively inexpensive.

The first circuit pattern layer 120, the second circuit pattern layer 130, the third circuit pattern layer 140, and the fourth circuit pattern layer 150 may be formed by an additive process, a subtractive process, a modified semi additive process (MSAP) and a semi additive process (SAP) method, which is a typical circuit board manufacturing process, and a detailed description thereof will be omitted herein.

Meanwhile, each of the first to fourth circuit pattern layers 120, 130, 140, and 150 includes a traces and a pad.

The trace refers to a long line-shaped wiring that transmits electrical signals. Additionally, the pad may refer to a mounting pad on which components such as chips are mounted, a core pad or BGA pad for connection to an external board, or a via pad connected to a via.

A first protective layer 160 may be disposed on the first or upper surface of the first insulating layer 111. The first protective layer 160 may include solder resist. The first protective layer 160 may include an opening (not shown) exposing a surface of the first circuit pattern layer 120. For example, the first protective layer 160 may include an opening exposing a pad 120P of the first circuit pattern layer 120.

Correspondingly, a second protective layer 170 may be disposed on the second surface of the third insulating layer 113. The second protective layer 170 may include solder resist. The second protective layer 170 may include an opening (not shown) exposing a surface of the pad (not shown) of the fourth circuit pattern layer 150.

Meanwhile, the circuit board of the embodiment includes a via. The via may electrically connect circuit pattern layers arranged in different layers. For example, a first via V1 may be formed in the first insulating layer 111. The first via V1 passes through the first insulating layer 111, and thus can electrically connect the first circuit pattern layer 120 and the second circuit pattern layer 130. For example, a second via V2 may be formed in the second insulating layer 112. The second via V2 passes through the second insulating layer 112, and thus can electrically connect the second circuit pattern layer 130 and the third circuit pattern layer 140. For example, a third via V3 may be formed in the third insulating layer 113. The third via V3 passes through the third insulating layer 113, and thus can electrically connect the third circuit pattern layer 140 and the fourth circuit pattern layer 150.

The vias V1, V2 and V3 as described above can be formed by filling the inside of the via hole formed in each insulating layer with a metal material. The via hole may be formed by any one of machining methods, including mechanical, laser, and chemical processing. When the via hole is formed by mechanical processing, methods such as milling, drilling, and routing may be used, and when the via hole is formed by laser processing, a UV or $CO_2$ laser method may be used, and when the via hole is formed by chemical processing, drugs containing amino silane, ketones, etc. may be used, and the like, thereby at least one insulating layer among the plurality of insulating layers may be opened.

When the via hole is formed, the vias V1, V2 and V3 may be formed by filling the inside of the via hole with a conductive material. Metal materials forming the vias V1, V2 and V3 may be any one material selected from Cu, Ag, Sn, Au, Ni, and Pd, and the metal material may be filled using any one or a combination of electroless plating, electrolytic plating, screen printing, sputtering, evaporation, ink jetting and dispensing.

Meanwhile, the circuit pattern layer and vias in the embodiment may have a multiple layer structure. For example, vias V1, V2, and V3 may have a two-layer structure. For example, the circuit pattern layers 120, 130, 140, and 150 may have a three-layer structure.

Hereinafter, the description will focus on the layer structure of the first circuit pattern layer 120 and the first via V1, which correspond to the outermost layer among the plurality of layers of the circuit board. However, the second via V2 and the third via V3 in the embodiment may have a structure corresponding to the first via V1 described below. In addition, the second circuit pattern layer 130, the third circuit pattern layer 140, and the fourth circuit pattern layer 150 in the embodiment may also have a structure corresponding to the first circuit pattern layer 120 described below.

The circuit board includes a first via V1 formed passing through a first insulating layer 111, a first circuit pattern layer 120 is disposed on an upper surface of the first insulating layer 111, and a second circuit pattern layer 130 is disposed on a lower surface of the first insulating layer 111.

In addition, the first circuit pattern layer 120 includes a first pad 120P that overlaps the first via V1 in a vertical direction and is in direct contact with the upper surface of the first via V1, and a trace 120T connected to the first pad 120P.

Additionally, the second circuit pattern layer 130 may include a second pad 130P that overlaps the first via V1 in a vertical direction and is in direct contact with the lower surface of the first via V1.

The first via V1 may include a first plating layer V1-1 and a second plating layer V1-2. The first plating layer V1-1 may be a plating layer formed on an inner wall of a via hole passing through the first insulating layer 111. As an example, the first plating layer V1-1 may be a chemical copper plating layer. The second plating layer V1-2 may be a plating layer formed by performing electrolytic plating using the first plating layer V1-1 as a seed layer. For example, the second plating layer V1-2 may be formed by filling the inside of the via hole by performing electrolytic plating using the first plating layer V1-1 as a seed layer.

The trace 120T of the first circuit pattern layer 120 may include a copper foil layer 120T1, a first plating layer 120T2, and a second plating layer 120T2. The copper foil layer 120T1 may be a copper foil layer attached to a surface of the first insulating layer 111 during a process of stacking the first insulating layer 111. For example, the circuit board may be composed of an RCC, and accordingly, the first insulating layer 111 and the copper foil layer 120T1 may constitute the RCC. The first plating layer 120T2 of the trace 120T may correspond to the first plating layer V1-1 of the first via V1. And, the second plating layer 120T3 of the trace 120T may correspond to the second plating layer V1-2 of the first via V1.

The first pad 120P of the first circuit pattern layer 120 may include a copper foil layer 120P1, a first plating layer 120P2, and a second plating layer 120P2. The copper foil layer 120P1 of the first pad 120P may be a copper foil layer attached to a surface of the first insulating layer 111 during a process of stacking the first insulating layer 111. For example, the circuit board may be composed of an RCC, and accordingly, the first insulating layer 111 and the copper foil layer 120P1 may constitute the RCC. The copper foil layer 120P1 of the first pad (120P) may correspond to the first copper foil layer 120T1 of the trace 120T. The first plating layer 120P2 of the first pad 120P may correspond to the first plating layer V1-1 of the first via V1 and the first plating layer 120T2 of the trace 120T. In addition, the second plating layer 120P3 of the first pad 120P may correspond to the second plating layer V1-2 of the first via V1 and the second plating layer 120T3 of the trace 120T.

Meanwhile, in an embodiment, the first plating layer 120P2 of the first pad 120P may not have a step. For example, the first plating layer 120P2 of the first pad 120P may not directly contact a surface of the first insulating layer 111. For example, the first plating layer 120P2 of the first pad 120P may not directly contact an upper surface of the first insulating layer 111. However, the first plating layer 120P2 may have a portion in direct contact with the upper surface of the first insulating layer (111) due to processing errors, etc. For example, in the embodiment, there may be a step portion where the first plating layer 120P2 and an upper surface of the first insulating layer 111 are in direct contact. However, in an embodiment, a horizontal length of the step portion may be formed to be less than or equal to a thickness of the trace 120T. Accordingly, in the embodiment, the length of the step portion can be minimized compared to the comparative example, and accordingly, the size of the via can be minimized. That is, the first plating layer of the comparative example in FIG. 1d includes a step. For example, the copper foil layer in the comparative example had a structure that exposed a portion of the upper surface of the insulating layer, and accordingly, the first plating layer in the comparative example included a portion in direct contact with the upper surface of the insulating layer.

Unlike this, the copper foil layer 120P1 of the first pad 120P in the embodiment does not expose the upper surface of the first insulating layer 111. Accordingly, in the embodiment, the first plating layer 120P2 of the first pad 120P does not directly contact the upper surface of the first insulating layer 111. For example, the first plating layer 120P2 of the first pad 120P in the embodiment does not have a step, unlike the structure in the comparative example.

Accordingly, in the embodiment, signal loss occurring in the first pad can be minimized compared to the structure of the first plating layer including the step in the comparative example, and accordingly, communication performance can be improved.

Meanwhile, in the embodiment, the first plating layer V1-1 of the first via V1 and the first plating layer 120P2 of the first pad 120P is an integrally formed chemical copper plating layer or electroless plating layer.

In this case, a surface roughness of the first plating layer V1-1 of the first via V1 in contact with the via hole of the first insulating layer 111 may be different from a surface roughness of the first plating layer 120P2 of the first pad 120P in contact with the side of the copper foil layer 120P1.

For example, in a comparative example, when a via hole is formed, the copper foil layer and insulating layer are simultaneously removed by a laser, and as a result, a surface roughness of a side surface of the copper foil layer and a roughness of an inner wall of the via hole of the insulating layer processed by the laser had a substantially similar level. Unlike this, in an embodiment, when a via hole is formed, the copper foil layer 120P1 of the first pad 120P is removed by etching, and the first insulating layer 111 is removed by laser processing. Accordingly, in the embodiment, a side surface of the copper foil layer 120P1 has a surface roughness caused by an etching process, and an inner wall of the via hole of the first insulating layer 111 has a surface roughness caused by a laser process. Accordingly, in the embodiment, the surface roughness of the first plating layer V1-1 of the first via V1 in contact with the inner wall of the via hole of the first insulating layer may be different from the surface roughness of the first plating layer 120P2 in contact with the side surface of the copper foil layer 120P1 of the first pad 120P.

Preferably, the surface roughness of the first plating layer V1-1 of the first via V1 in contact with the inner wall of the via hole of the first insulating layer may be greater than the surface roughness of the first plating layer 120P2 in contact with the side surface of the copper foil layer 120P1 of the first pad 120P. Through this, the surface roughness of the first plating layer 120P2 in contact with the side surface of the copper foil layer 120P1 of the first pad 120P can be reduced, thereby reducing signal loss due to skin effect.

Correspondingly, in an embodiment, an inclination angle of the side surface of the copper foil layer 120P1 of the first pad 120P may be different from an inclination angle of the inner wall of the via hole of the first insulating layer 111.

For example, a first inclination angle $\theta 1$ between a virtual first line L1 extending from the side of the copper foil layer 120P1 and a reference line BL may be close to 90 degrees. For example, the first inclination angle $\theta 1$ may range from 85 degrees to 95 degrees. For example, the first inclination angle $\theta 1$ may range from 87 degrees to 93 degrees. For example, the first inclination angle $\theta 1$ may range from 88 degrees to 92 degrees. Here, the reference line BL may be parallel to the upper or lower surface of the first insulating layer 111.

Additionally, a second inclination angle $\theta 2$ between a virtual second line L2 extending from the inner wall of the via hole and the reference line BL may be greater than the first inclination angle $\theta 1$. For example, the second inclination angle $\theta 1$ may range from 96 degrees to 120 degrees. For example, the second inclination angle $\theta 2$ may range from 97 degrees to 110 degrees. For example, the second inclination angle $\theta 2$ may range from 98 degrees to 105 degrees. At this time, the second inclination angle $\theta 2$ may mean an average value of an inclination angle of the inner wall of the via hole. At this time, the copper foil layer 120P1 of the first pad 120P is removed by etching, as a result, the first inclination angle $\theta 1$ of the side surface of the copper foil layer 120P1 of the first pad 120P may be close to vertical with respect to the surface (upper or lower surface) of the first insulating layer 111. Unlike this, the via hole of the first insulating layer 111 is formed by laser processing, as a result, the via hole of the first insulating layer 111 may have a second inclination angle $\theta 2$ that is greater than the first inclination angle $\theta 1$.

Meanwhile, an angle between the upper surface of the first insulating layer 111 and an upper end of the inner wall of the via hole may have an obtuse angle $\theta 3$, and an angle between the lower surface of the first insulating layer 111 and a lower end of the inner wall of the via hole may have an acute angle $\theta 4$. In other words, the first inclination angle $\theta 1$ of the side surface of the copper foil layer of the first pad 120P in the embodiment may be different from the inclination angle $\theta 2$ of the inner wall of the via hole of the first insulating layer 111.

Meanwhile, although the first via V1, the first circuit pattern layer 120, and the second circuit pattern layer 130 formed in the first insulating layer 111 have been described above, the second via V2, The third via V3, the third circuit pattern layer 140, and the fourth circuit pattern layer 150 may also be formed to have a structure corresponding thereto.

Meanwhile, hereinafter, a structure of the via according to the embodiment will be described in more detail.

The via in the embodiment may be a small via. Here, a small via may mean that there is almost no difference between a first width of a portion with a maximum width and a second width of a portion with a minimum width in an entire region of the via.

At this time, in a general circuit board, an insulating layer is formed using a photosensitive material to form a small via. For example, it is known that the insulating layer on a general circuit board forms a via by applying PID (Photo Imageable Dielectric), a photosensitive material, to implement a small via.

However, PID, which is generally a photosensitive material, has a dielectric constant (Dk) exceeding 3.0, and accordingly, it is difficult to apply it to boards that use frequencies higher than those for 5G. For example, in a 5G board, a dielectric constant of the board must be low. However, the dielectric constant of general PID exceeds 3.0. Accordingly, when applying the PID to a 5G board, there is a problem that signal transmission loss increases when transmitting a large signal.

In addition, when a circuit board is implemented using a PID, a sputter, which is a deposition equipment, must be used in the plating process for circuit formation on the circuit board including the PID, which has the problem of increasing process costs. Furthermore, in the circuit board including the PID, there is a problem in that the adhesion between the insulating layer composed of the PID and the circuit pattern is low; and as a result, the circuit pattern is separated from the insulating layer. For example, the circuit board including a PID requires a high process temperature (e.g., 250 degrees or more) during the circuit pattern formation process or soldering process. Due to such a high processing temperature, the adhesion between the PID and the circuit pattern is reduced, causing the circuit pattern to be separated from the insulating layer.

Accordingly, in the embodiment, the insulating layer 110 is configured using RCC. The RCC has a structure in which a copper foil layer is attached to an insulating layer, and accordingly, an adhesion between the insulating layer and the copper foil layer is higher than that of a circuit board using PID. Furthermore, RCC has a low dielectric constant (Dk) in a range of 2.0 to 3.0, and therefore can be applied to products that transmit signals in the high frequency band for 5G.

That is, the insulating layer 110 in the embodiment may have a dielectric constant (Dk) between 2.0 and 3.0. If the dielectric constant of the insulating layer 111 is less than 2.0, there is a problem that the processability of the material is reduced. For example, if the dielectric constant of the insulating layer 111 is less than 2.0, the strength is weak, bending characteristics may deteriorate during the formation of vias or circuit patterns, and process characteristics are deteriorated. Additionally, if the dielectric constant (Dk) of the insulating layer 111 exceeds 3.0, there is a problem of increased signal loss.

Accordingly, the insulating layer 110 in the embodiment has a dielectric constant (Dk) between 2.0 and 3.0. For example, the insulating layer 110 in the embodiment may be formed of RCC or prepreg having a dielectric constant (Dk) between 2.0 and 3.0. Accordingly, the embodiment may provide a circuit board having a low dielectric constant, and accordingly, it can be applied to 5G products and solves the reliability problem of the PID.

At this time, the RCC or prepreg as described above has a structure including a copper foil layer. Therefore, as in the comparative example, there may be difficulties in a process of forming via holes by processing the copper foil layer and insulating layer with a laser.

On the other hand, in the embodiment, when forming a via hole in an insulating layer on which a copper foil layer is laminated, the copper foil layer is first removed. For example, in the embodiment, a portion of the copper foil layer corresponding to a location where the via hole is formed is first removed by etching. And, in the embodiment, a laser processing process is performed on a surface of the insulating layer exposed through removal of the copper foil layer to form a via hole of a desired size. Accordingly, in the embodiment, only the insulating layer needs to be processed in the via hole forming process, and thus the intensity of the laser can be lowered compared to the comparative example. Through this, in the embodiment, the difference between the maximum and minimum widths of the via hole can be reduced, and thus a small via can be formed.

For example, the via V1 in the embodiment may have a first width W1 at the upper surface. For example, in the embodiment, the upper surface of the via V1 may have a first width W1. The first width W1 may refer to the maximum width at the upper surface of the via V1. For example, the width of the upper surface of the via V1 may be different in a width direction, a longitudinal direction, and a plurality of diagonal directions therebetween. And, the first width W1 may mean a largest width among the widths in each direction (for example, a width in a direction with the largest width).

Alternatively, the first width W1 may mean an average value of the width of the upper surface of the via V1 in each direction.

Meanwhile, the via V1 in the embodiment may have a second width W2 in a first region. For example, in an embodiment, the via V1 may have a minimum width of the second width W2 in the first region.

At this time, when a via hole is formed through a laser process, an ideal shape of the via hole has a trapezoidal shape with the width gradually narrowing from an upper portion to a lower portion. Accordingly, the via filling the inside of the via hole as described above has the maximum width at the upper surface and the minimum width at the lower surface. However, due to the material characteristics of the insulating layer and processing characteristics in the laser process, the via hole and via do not have a trapezoidal shape. For example, as shown in FIG. 4, a vertical cross section of the via hole has a shape in which the width changes irregularly rather than a trapezoidal shape in which the width gradually changes in a thickness direction.

In addition, the second width W2 may refer to a width of a region having a smallest width among all regions of the via V1 in the embodiment. In other words, the first region may mean a region with the minimum width among all regions in the thickness direction of the via V1.

Meanwhile, the minimum width of the via in the comparative example was less than 60% of the maximum width.

In contrast, the second width W2 of the via V1 in the embodiment may range from 70% to 99% of the first width W1. For example, in an embodiment, the second width W2 of the via V1 may range from 75% to 90% of the first width W1. For example, in an embodiment, the second width W2 of the via V1 may range from 80% to 85% of the first width W1.

If the second width W2 of the via V1 is smaller than 70% of the first width W1, it is difficult to miniaturize the via. Additionally, if the second width W2 of the via V1 is less than 70% of the first width W1, there is a problem in that the loss of the signal transmitted through the via V1 increases. Additionally, if the second width W2 of the via V1 is greater than 99% of the first width W1, there is a problem in that laser processability is deteriorated.

Meanwhile, in the embodiment, one-half (½) value of the difference (ΔW1) between the first width W1 and the second width W2 of the via V1 may range from 0.1% to 15% of the first width W1. For example, in the embodiment, one-half (½) value of the difference (ΔW1) between the first width W1 and the second width W2 of the via V1 may range from 1% to 15% of the first width W1. For example, in the embodiment, one-half (½) value of the difference (ΔW1) between the first width W1 and the second width W2 of the via V1 may range from 2% to 10% of the first width W1.

In the embodiment, if one-half (½) of the difference (ΔW1) between the first width W1 and the second width W2 of the via V1 is greater than 15% of the first width W1, there is a problem in that it is difficult to miniaturize the size of the via, and the loss in the signal transmitted through the via (V1) increases. In addition, if one-half (½) value of the difference (ΔW1) between the first width W1 and the second width W2 of the via V1 in the embodiment is less than 0.1%, there is a problem that laser processability is deteriorated.

As described above, in the embodiment, the difference between the first width W1 of the upper surface of the via V1 and the second width W2 of the smallest width part of the entire region of the via V1 is minimized. Accordingly, it is possible to miniaturize the via V1. Furthermore, in the embodiment, the difference between the first and second widths of the via is minimized, thereby minimizing signal transmission loss.

Meanwhile, in the embodiment, as the difference between the first width W1 and the second width W2 of the via V1 is minimized as described above, the width of the first pad 120P disposed on the upper surface of the via V1 can be reduced.

For example, in the comparative example, a step region existed on the upper surface of the via, and the width of the pad disposed on the upper surface of the via had to be increased to correspond to the step region. For example, in the comparative example, the width of the pad was determined to correspond to the size in the step region.

In contrast, in the embodiment, the step region of the via can be removed, and further, the difference between the first width W1 and the second width W2 of the via can be minimized. Accordingly, in the embodiment, the width of the first pad 120P disposed on the upper surface of the via V1 can be reduced.

For example, in the embodiment, the first pad 120P may have a third width W3. The third width W3 may refer to the width in the direction having the minimum width among the widths in each direction of the first pad 120P. Alternatively, the third width W3 may mean an average value of the widths of the first pad 120P in each direction.

For example, the width of the upper surface of the first pad 120P may be different in a width direction, a longitudinal direction, and a plurality of diagonal directions therebetween. And, the third width W3 may mean a minimum width (for example, a width in a direction having a smallest width) among the widths in each direction. Alternatively, the third width W3 may mean an average value of the widths of the first pad 120P in each direction. In the embodiment, one-half (½) of the difference between the third width W3 of the first pad 120P and the second width W2 of the via V1 may be greater than 0.01 μm and less than or equal to 4.0 μm. For example, one-half (½) of the difference between the third width W3 of the first pad 120P and the second width W2 of the via V1 may be greater than 0.01 μm and less than or equal to 3.0 μm. For example, one-half (½) of the difference between the third width W3 of the first pad 120P and the second width W2 of the via V1 may be greater than 0.01 μm and less than or equal to 2.0 μm. For example, one-half (½) of the difference between the third width W3 of the first pad 120P and the second width W2 of the via V1 may be greater 0.01 μm and less than or equal to 1.0 μm.

That is, in the comparative example, as described above, due to the difference between the maximum and minimum widths of the via, one-half (½) of the difference between the width of the first pad and the minimum width of the via is greater than 4.5 μm.

On the other hand, the embodiment may allow one-half (½) of the difference between the width of the first pad and the minimum width of the via to be managed to 4.0 μm or less, further 3.0 μm or less, furthermore, 2.0 μm or less, and furthermore, 1.0 μm or less, and thus the first pad 120P can be miniaturized, thereby improving circuit integration.

In addition, in the embodiment, one-half (½) of the difference between the third width W3 of the first pad 120P and the first width W1 of the via V1 may range between 0.75 μm to 2.97 μm. For example, in the embodiment, one-half (½) of the difference between the third width W3 of the first pad 120P and the first width W1 of the via V1 may range between 1.0 μm and 2.2 μm. For example, in the embodiment, one-half (½) of the difference between the third width W3 of the first pad 120P and the first width W1 of the via V1 may range between 1.2 μm and 2.0 μm. Through this, in the embodiment, the size of the first pad 120P can be reduced by miniaturizing the via V1, and further, circuit integration can be improved.

The embodiment manufactures a circuit board using RCC or prepreg rather than a photosensitive material. That is, PID, which is generally a photosensitive material, has a dielectric constant (Dk) exceeding 3.0, and accordingly, it is difficult to apply it to boards that use frequencies higher than those for 5G. For example, in a 5G board, a dielectric constant of the board must be low. However, the dielectric constant of general PID exceeds 3.0. Accordingly, when applying the PID to a 5G board, there is a problem that signal transmission loss increases when transmitting a large signal. In addition, when a circuit board is implemented using a PID, a sputter, which is a deposition equipment, must be used in the plating process for circuit formation on the circuit board including the PID, which has the problem of increasing process costs. Furthermore, in the circuit board including the PID, there is a problem in that the adhesion between the insulating layer composed of the PID and the circuit pattern is low, and as a result, the circuit pattern is separated from the insulating layer. For example, the circuit board including a PID requires a high process temperature (e.g., 250 degrees or more) during the circuit pattern formation process or soldering process. Due to such a high processing temperature, the adhesion between the PID and the circuit pattern is reduced, causing the circuit pattern to be separated from the insulating layer.

Accordingly, the insulating layer in the embodiment may be formed of RCC or prepreg having a dielectric constant (Dk) between 2.0 and 3.0. Accordingly, the embodiment provides a circuit board with a low dielectric constant, enabling application to 5G products and solving the reliability problem of the PID.

Meanwhile, the insulating layer containing RCC or prepreg has limitations in forming small vias. At this time, the embodiment allows the copper foil layer to be removed first when forming a via hole in an insulating layer in which a copper foil layer is laminated on its surface. For example, the embodiment allows some regions of the copper foil layer corresponding to locations where via holes were formed to be preferentially removed by etching. And, in the embodiment, a laser processing process is performed on the surface of the insulating layer exposed through removal of the copper foil layer to form a via hole of a desired size. Accordingly, in the embodiment, only the insulating layer needs to be processed in the via hole forming process, and thus an intensity of the laser can be lowered compared to a comparative example. Through this, the embodiment can reduce the difference between the maximum and minimum width of the via hole, thereby enabling the formation of a small via.

FIG. 5 is a view showing a package substrate according to an embodiment.

The package substrate of the embodiment may have a structure in which at least one chip is mounted on the circuit board of FIG. 2.

For example, the package substrate may include a connection part 210 disposed on the first pad 120P of the first circuit pattern layer 120 disposed on the first outermost side of the circuit board.

The connection part 210 may have a spherical shape. For example, a cross section of the connection part 210 may include a circular shape or a semicircular shape. For example, a cross section of the connection part 210 may include a partially or entirely rounded shape. A cross-sectional shape of the connection part 210 may be flat on one side and curved on the other side. The connection part 210 may be a solder ball, but is not limited thereto.

Alternatively, the connection part 210 may have a hexahedral shape. For example, a cross section of the connection part 210 may have a rectangular shape. A cross section of the connection part 210 may include a rectangle or square.

The package substrate of the embodiment may include a chip 220 disposed on the connection part 210. The chip 220 may be a processor chip. For example, the chip 220 may be an application processor (AP) chip of any one of a central processor (e.g., CPU), graphics processor (e.g., GPU), digital signal processor, cryptographic processor, microprocessor, and microcontroller.

At this time, a terminal 225 may be included on a lower surface of the chip 220, and the terminal 225 may be electrically connected to the first circuit pattern layer 120 of the circuit board through the connection part 210.

Meanwhile, the package substrate of the embodiment may allow a plurality of chips to be arranged at a certain distance from each other on one circuit board. For example, the chip 220 may include a first chip and a second chip that are spaced apart from each other.

Also, the first chip and the second chip may be different types of application processor (AP) chips.

Meanwhile, the first chip and the second chip may be spaced apart from each other at a certain distance on the circuit board. For example, a distance between the first chip and the second chip may be 150 µm or less. For example, a distance between the first chip and the second chip may be 120 µm or less. For example, a distance between the first chip and the second chip may be 100 µm or less.

Preferably, for example, a distance between the first chip and the second chip may range from 60 µm to 150 µm. For example, a distance between the first chip and the second chip may range from 70 µm to 120 µm. For example, a distance between the first chip and the second chip may range from 80 µm to 110 µm. For example, if the distance between the first chip and the second chip is less than 60 µm, interference between the first chip and the second chip may occur, which may cause problems with the operational reliability of the first chip or the second chip. For example, if the distance between the first chip and the second chip is greater than 150 µm, signal transmission loss may increase as the distance between the first chip and the second chip increases.

The package substrate may include a molding layer 230. The molding layer 230 may be disposed to cover the chip 220. For example, the molding layer 230 may be EMC (Epoxy Mold Compound) formed to protect the mounted chip 220, but is not limited thereto.

At this time, the molding layer 230 may have a low dielectric constant to increase heat dissipation characteristics. For example, the dielectric constant (Dk) of the molding layer 230 may be 0.2 to 10. For example, the dielectric constant (Dk) of the molding layer 230 may be 0.5 to 8. For example, the dielectric constant (Dk) of the molding layer 230 may be 0.8 to 5. Accordingly, in the embodiment, the molding layer 230 has a low dielectric constant to improve heat dissipation characteristics for heat generated from the chip 220.

Meanwhile, the package substrate may include a solder ball 240 disposed on the lowermost side of the circuit board. The solder ball 240 may be used for bonding between the package substrate and an external substrate (e.g., a main board of an external device).

Hereinafter, a method of manufacturing a circuit board according to an embodiment will be described.

At this time, in the method for manufacturing the circuit board of the embodiment, it is substantially the same as the prior art except for the process of forming vias, and accordingly, the description will be based on the process of forming a via in at least one layer among a plurality of layers.

FIGS. 6 to 10 are views showing the manufacturing method of the circuit board shown in FIG. 2 in order of processes.

Hereinafter, the method for manufacturing the circuit board shown in FIG. 2 will be described in detail with reference to the drawings.

Referring to FIG. 6, in the embodiment, a second insulating layer 112 is prepared. In addition, when the second insulating layer 112 is prepared, the embodiment can proceed with a process of forming the second circuit pattern layer 130, the third circuit pattern layer 140, and the second via V2 on the second insulating layer 112. To explain this briefly, when the second insulating layer 112 is prepared, the embodiment can proceed with a process of forming a seed layer (not shown) on one or both surfaces of the second insulating layer 112. At this time, the second insulating layer 112 may be CCL (Copper Clad Laminate), and accordingly, the seed layer may be a copper foil layer constituting the CCL. Alternatively, the seed layer may be formed on at least one of the first and second surfaces of the second insulating layer 112 through electroless plating. Next, the embodiment can proceed with a process of forming a second via hole in the second insulating layer 112 on which the seed layer is formed. Then, the embodiment may proceed with a process of forming a mask (not shown) including an opening on at least one of the first and second surfaces of the second insulating layer 112, and a process of forming at least one circuit pattern layer of the second circuit pattern layer 130 and the third circuit pattern layer 140 and the second via V2 by performing plating within the opening of the mask.

Next, referring to FIG. 7, the embodiment can proceed with a process of laminating the first insulating layer 111 on the first or upper surface of the second insulating layer 112 and a process of laminating the third insulating layer 113 on the second or lower surface of the second insulating layer 112.

At this time, the first insulating layer 111 and the third insulating layer 113 may be RCC.

Accordingly, copper foil layers (M1, M2) may be formed on a first surface of the first insulating layer 111 and a second surface of the third insulating layer 113, respectively.

Next, the embodiment can proceed with a process of forming via holes in the first insulating layer 111 and the third insulating layer 113.

At this time, in the comparative example, the first insulating layer 111 and the copper foil layer M1 were simultaneously opened through a laser process to form via holes penetrating each insulating layer, or the third insulating layer 113 and the copper foil layer M2 were simultaneously opened through a laser process to form via holes penetrating each insulating layer.

Unlike this, in the embodiment, the via hole is formed in a plurality of steps.

To this end, referring to FIG. 8, the embodiment can proceed with an etching process to remove the region where via holes will be formed in the copper foil layer M1 and M2. Specifically, the embodiment can proceed with a process of forming holes MH1 and MH2 in the copper foil layers M1 and M2.

A size of the holes MH1 and MH2 in the copper foil layers M1 and M2 may correspond to a size of the via hole to be formed in each insulating layer.

Next, referring to FIG. 9, the embodiment can proceed with a process of forming via holes by irradiating a laser to the surface of the insulating layer exposed through holes MH1 and MH2 in the copper foil layer M1 and M2.

For example, the embodiment can proceed with a process of forming a first via hole VHI penetrating the first insulating layer 111 by irradiating a laser to the upper surface of the first insulating layer 111 exposed through the hole MH1 formed in the copper foil layer M1.

For example, the embodiment can proceed with a process of forming a third via hole VH3 penetrating the third insulating layer 113 by irradiating a laser to the lower surface of the third insulating layer 113 exposed through the hole MH2 formed in the copper foil layer M2.

Next, referring to FIG. 10, the embodiment can proceed with a process of forming a first via V1 and a third via V3 to fill the first via hole VHI and the third via hole (VH3), a process of forming a first circuit pattern layer 120 on the upper surface of the first insulating layer 111, a process of forming a fourth circuit pattern layer 150 on the lower surface of the third insulating layer 113, and a process of forming protective layers 160 and 170 on the upper surface of the first insulating layer 111 and the lower surface of the third insulating layer 113, respectively.

The embodiment manufactures a circuit board using RCC or prepreg rather than a photosensitive material. That is, PID, which is generally a photosensitive material, has a dielectric constant (Dk) exceeding 3.0, and accordingly, it is difficult to apply it to boards that use frequencies higher than those for 5G. For example, in a 5G board, a dielectric constant of the board must be low. However, the dielectric constant of general PID exceeds 3.0. Accordingly, when applying the PID to a 5G board, there is a problem that signal transmission loss increases when transmitting a large signal. In addition, when a circuit board is implemented using a PID, a sputter, which is a deposition equipment, must be used in the plating process for circuit formation on the circuit board including the PID, which has the problem of increasing process costs. Furthermore, in the circuit board including the PID, there is a problem in that the adhesion between the insulating layer composed of the PID and the circuit pattern is low, and as a result, the circuit pattern is separated from the insulating layer. For example, the circuit board including a PID requires a high process temperature (e.g., 250 degrees or more) during the circuit pattern formation process or soldering process. Due to such a high processing temperature, the adhesion between the PID and the circuit pattern is reduced, causing the circuit pattern to be separated from the insulating layer.

Accordingly, the insulating layer in the embodiment may be formed of RCC or prepreg having a dielectric constant (Dk) between 2.0 and 3.0. Accordingly, the embodiment provides a circuit board with a low dielectric constant, enabling application to 5G products and solving the reliability problem of the PID.

Meanwhile, the insulating layer containing RCC or prepreg has limitations in forming small vias. At this time, the embodiment allows the copper foil layer to be removed first when forming a via hole in an insulating layer in which a copper foil layer is laminated on its surface. For example, the embodiment allows some regions of the copper foil layer corresponding to locations where via holes were formed to be preferentially removed by etching. And, in the embodiment, a laser processing process is performed on the surface of the insulating layer exposed through removal of the copper foil layer to form a via hole of a desired size. Accordingly, in the embodiment, only the insulating layer needs to be processed in the via hole forming process, and thus an intensity of the laser can be lowered compared to a comparative example. Through this, the embodiment can reduce the difference between the maximum and minimum width of the via hole, thereby enabling the formation of a small via. The characteristics, structures, effects, and the like described in the above-described embodiments are included in at least one embodiment, but are not limited to only one embodiment. Furthermore, the characteristic, structure, and effect illustrated in each embodiment may be combined or modified for other embodiments by a person skilled in the art. Therefore, it should be construed that contents related to such combination and modification are included in the scope of the embodiment.

Embodiments are mostly described above, but the embodiments are merely examples and do not limit the embodiments, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the embodiment defined in the following claims.

The invention claimed is:

1. A circuit board comprising:
    an insulating layer;
    a via electrode provided to pass through the insulating layer;
    a first circuit pattern layer disposed on an upper surface of the insulating layer; and
    a second circuit pattern layer disposed on a lower surface of the insulating layer, wherein the via electrode includes an upper surface, a lower surface, and a first region between the upper surface and the lower surface, wherein the upper surface of the via electrode has a first width along a horizontal direction, wherein the first region has a second width that is smaller than the first width along the horizontal direction, wherein the first region is a region in the via electrode with a smallest width in the horizontal direction, wherein the second width satisfies a range of 70% to 99% of the first width, wherein the first circuit pattern layer includes an upper via pad connected to the via electrode, wherein the upper via pad includes a copper foil layer disposed on the insulating layer, a first plating layer disposed on the copper foil layer, and a second plating layer disposed on the first plating layer, wherein the upper via pad has a third width along the horizontal direction, and wherein one-half of a difference between the third width and the first width of the via satisfies a range of 0.75 μm to 2.97 μm.

2. The circuit board of claim 1, wherein the first plating layer is a chemical copper plating layer, and the second plating layer is an electrolytic plating layer.

3. The circuit board of claim 1, wherein the first width is one of a maximum width and an average width in the horizontal direction along a circumferential direction of the upper surface of the via electrode.

4. The circuit board of claim 1, wherein one-half of a difference between the first width and the second width of the via electrode satisfies a range of 0.1% to 20% of the first width.

5. The circuit board of claim 1, wherein the upper via pad has a third width along the horizontal direction, and
wherein one-half of a difference between the third width and the second width is 4.0 μm or less.

6. The circuit board of claim 1, wherein the first plating layer is spaced apart from the upper surface of the insulating layer.

7. The circuit board of claim 1, wherein a side surface of the copper foil layer of the upper via pad has a first slope along a vertical direction, and
wherein the via electrode has a second slope different from the first slope along the vertical direction.

8. The circuit board of claim 7, wherein the first slope is closer to 90° than the second slope.

9. The circuit board of claim 7, wherein the first slope is directly connected to an upper end of the second slope.

10. The circuit board of claim 1, wherein the insulating layer includes one of RCC (Resin coated copper) or prepreg.

11. A semiconductor package comprising:
an insulating layer;
a circuit pattern layer disposed on the insulating layer;
a via electrode passing through the insulating layer and connected to the circuit pattern layer; and
a semiconductor device disposed on the circuit pattern layer, wherein the via electrode includes an upper surface, a lower surface, and a first region between the upper surface and the lower surface, wherein the upper surface of the via electrode has a first width along a horizontal direction, wherein the first region has a second width that is smaller than the first width along the horizontal direction, wherein the first region is a region in the via electrode with a smallest width in the horizontal direction, wherein the second width satisfies a range of 70% to 99% of the first width, wherein the circuit pattern layer includes a via pad connected to the via electrode, wherein the via pad includes a copper foil layer disposed on the insulating layer, a first plating layer disposed on the copper foil layer, and a second plating layer disposed on the first plating layer, wherein the via pad has a third width along the horizontal direction, and wherein one-half of a difference between the third width and the first width of the via satisfies a range of 0.75 μm to 2.97 μm.

12. The semiconductor package of claim 11, wherein the first plating layer is a chemical copper plating layer, and the second plating layer is an electrolytic plating layer.

13. The semiconductor package of claim 11, wherein one-half of a difference between the first width and the second width of the via electrode satisfies a range of 0.1% to 20% of the first width.

14. The semiconductor package of claim 11, wherein the first plating layer is spaced apart from the upper surface of the insulating layer.

15. The semiconductor package of claim 11, wherein a side surface of the copper foil layer of the upper via pad has a first slope along a vertical direction,
wherein the via electrode has a second slope different from the first slope along the vertical direction,
wherein the first slope is closer to 90° than the second slope, and
wherein the first slope is directly connected to an upper end of the second slope.

* * * * *